US005902462A

United States Patent [19]
Krauss

[11] Patent Number: 5,902,462
[45] Date of Patent: May 11, 1999

[54] FILTERED CATHODIC ARC DEPOSITION APPARATUS AND METHOD

[76] Inventor: Alan R. Krauss, 24461 W. Blvd. De John, Naperville, Ill. 60564

[21] Appl. No.: 08/828,026

[22] Filed: Mar. 27, 1997

[51] Int. Cl.⁶ .................................................. C23C 14/24
[52] U.S. Cl. ........................ 204/192.38; 204/298.41; 427/580
[58] Field of Search .................... 204/192.38, 298.41; 118/723 VE, 723 MP, 723 R; 427/580

[56] References Cited

U.S. PATENT DOCUMENTS

| | | | |
|---|---|---|---|
| 4,269,137 | 5/1981 | Johnson | 118/723 VE |
| 4,448,802 | 5/1984 | Buhl et al. | 204/298.41 |
| 4,452,686 | 6/1984 | Axenov et al. | 204/298.41 |
| 4,929,321 | 5/1990 | Buhl | 204/298.41 |
| 5,037,522 | 8/1991 | Verguson . | |
| 5,126,030 | 6/1992 | Tamagaki et al. | 204/192.38 |
| 5,282,944 | 2/1994 | Sanders et al. | 204/192.38 |
| 5,294,322 | 3/1994 | Vetter et al. | 204/192.38 |
| 5,298,136 | 3/1994 | Ramalingam | 204/198.38 |
| 5,317,235 | 5/1994 | Treglio | 204/298.41 |
| 5,401,543 | 3/1995 | O'Neill et al. | 204/192.38 |
| 5,435,900 | 7/1995 | Gorokhovsky | 204/298.41 |
| 5,468,363 | 11/1995 | Falabella | 204/298.41 |
| 5,480,527 | 1/1996 | Welty | 204/298.41 |
| 5,518,597 | 5/1996 | Storer et al. | 204/192.38 |
| 5,554,853 | 9/1996 | Rose | 250/492.21 |

*Primary Examiner*—Nam Nguyen
*Assistant Examiner*—Rodney G. McDonald
*Attorney, Agent, or Firm*—Lisa M. Soltis; Mark P. Dvorscak; William R. Moser

[57] ABSTRACT

A filtered cathodic arc deposition method and apparatus for the production of highly dense, wear resistant coatings which are free from macro particles. The filtered cathodic arc deposition apparatus includes a cross shaped vacuum chamber which houses a cathode target having an evaporable surface comprised of the coating material, means for generating a stream of plasma, means for generating a transverse magnetic field, and a macro particle deflector. The transverse magnetic field bends the generated stream of plasma in the direction of a substrate. Macro particles are effectively filtered from the stream of plasma by traveling, unaffected by the transverse magnetic field, along the initial path of the plasma stream to a macro particle deflector. The macro particle deflector has a preformed surface which deflects macro particles away from the substrate.

17 Claims, 5 Drawing Sheets

FILTERED CATHODIC ARC DEPOSITION APPARATUS AND METHOD

CONTRACTUAL ORIGIN OF THE INVENTION

The United States Government has rights in this invention pursuant to Contract Number W-31-109-ENG-38 between the United States Government and Argonne National Laboratory.

BACKGROUND OF INVENTION

1. Field of the Invention

The present invention relates to a filtered cathodic arc source, wherein the filtering eliminates or reduces macro particles from the generated stream of plasma.

2. Background of the Invention

Cathodic arc deposition is an effective means for depositing thin films onto various substrates. A cathodic arc source apparatus generally includes a vacuum chamber, a cathode target having an evaporable surface which is made of the coating material, a means for igniting a stream of plasma at the cathode, and a substrate which receives the coating. If required, magnetic and electrostatic fields are generated to direct the plasma stream through the vacuum chamber and to the substrate.

A cathodic arc discharge occurs when a low voltage, high current power source is connected between the cathode and the vacuum chamber. Arc spots form on the surface of the cathode, producing a highly ionized stream of plasma which consists of vaporized cathode material including ions, neutral atoms, and electrons. The stream of plasma flows away from the surface of the cathode and is deposited on the substrate, forming a coating thereon. Cathodic arc deposition can also be used to produce a beam of high energy ions for ion implantation or surface modification.

A major benefit of cathodic arc deposition is the production of high density, uniform, adherent films. The films have excellent hardness and wear resistance, and can be deposited at very high growth rates. For example, diamond like carbon (DLC) coatings, which can be produced by using a graphite cathode, are exceptionally smooth and have diamond-like qualities, including extreme hardness, extremely low electrical conductivity, low coefficients of friction, and optical transparency over a wide range of wavelengths. DLC coatings are anti-corrosive and wear resistant, which make them particularly desirable for semi-conductor and tool manufacturing applications.

A problem associated with cathodic arc deposition is the generation of macro particles in the form of droplets of molten target material of about 0.1 to 50 microns in diameter. Macro particles are produced at the arc spot when the presence of the arc superheats the cathode target. Macro particles cause surface irregularities in the deposited coating by becoming either permanently imbedded or temporarily affixed in the coating and later detaching. Macro particles thus result in undesirable non-uniformities which make the coatings unsuitable for particular mechanical, electronic, and optical applications.

Two solutions to the above cited problem have been developed in the prior art. The first prevents macro particles from forming by controlling the location of the arc on the surface of the cathode target, and the second filters macro particles from the plasma stream before they reach the substrate.

Conventional methods of controlling the arc path over the surface of the cathode target include steering the arc by using magnetic fields and/or employing a cathode target of a particular shape. For example, U.S. Pat. No. 5,480,527 to Welty discloses a rectangular planar cathode and a magnetic field reversal technique which eliminates the splattering of molten droplets which form macro particles. Welty teaches reversing the magnetic field each time the arc reaches one end of the rectangular cathode, causing the arc to scan back and forth along the cathode surface and preventing any one region of the cathode from getting hot enough to "splatter" particles.

U.S. Pat. No. 5,126,031 to Tamagaki, et al. discloses generating a magnetic field that causes the arc spot to rotate circularly and at a high velocity. This design also reduces the generation of macro particles by shortening the time the arc spot resides at a certain position on the cathode target.

Although arc steering methods represent simpler solutions than filtering methods, arc steering does not completely eliminate macro particle generation. In addition, where a magnetic field is also used to separate macro particles from a plasma stream, the macro particle separation magnetic field may be stronger than and interfere with the arc steering magnetic field, such that control over the arc position is lost.

Conventional filtering methods provide for an angled vacuum chamber or plasma duct configuration, where no line of sight exists between the cathode target and the substrate. Using this technique, a magnetic and/or electrostatic field guides the plasma stream through the angled plasma duct and to the substrate. While the plasma stream bends around the elbow of the duct, macro particles, which are unaffected by the magnetic and/or electrostatic field, continue along the initial trajectory, substantially a straight line, and are thus separated or filtered from the plasma stream. In addition, baffles or traps can be used in an attempt to prevent macro particles from being deflected in the direction of the substrate by angled or curved plasma duct walls.

U.S. Pat. No. 5,279,723 to Falabella, et al., discloses a bent plasma duct in which two straight solenoids placed end-to-end and at a 45 degree angle generate a magnetic field with magnetic field lines nearly parallel to the bent plasma duct walls. The magnetic field constrains the electrons in the plasma stream, and the flow of the electrons produces the electrostatic field required to guide the ions around the bend in the plasma duct. In addition, a series of baffles comprised of annular rings are provided along the duct walls to trap and deflect macro particles away from the substrate.

U.S. Pat. No. 5,433,836 to Martin, et al., discloses filtering macro particles by using a minimally non-linear duct, in addition to an extended magnetic field which produces the required bending and confining of the plasma. The extended magnetic field is generated by toroids to define the non-linear plasma duct, which comprises a tubular anode having a length that is six times greater than the length of the cathode.

Although filtering systems may successfully remove larger macro particles from the plasma stream, not all macro particles are effectively filtered. Furthermore, the use of an angled or curved plasma duct dictates that macro particles which strike the duct wall are likely to bounce or be deflected in the direction of the substrate, despite the use of baffles.

There exists a significant and continuing demand for filtered cathodic arc sources which eliminate macro particles from the deposited coating.

Therefore, in view of the above, a basic object of the present invention is to separate macro particles from a stream of plasma generated by a cathodic arc source, such that macro particles are not present in the resultant coating.

Another object of this invention is to use a transverse magnetic field to guide a stream of plasma to a substrate, wherein the substrate is not in the line of sight of the cathode target.

Another object of this invention is to position a particle deflector within a vacuum chamber of a cathodic arc source which intercepts and deflects macro particles away from the substrate.

Yet another object of this invention is to provide a macro particle deflector having a conical and tapered surface, including a flange, for deflecting macro particles away from the substrate.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentation and combinations particularly pointed out in the appended claims.

SUMMARY OF THE INVENTION

Briefly, the present invention relates to a filtered cathodic arc source, and more particularly, to a filtered cathodic arc source in which a transverse magnetic field is used to guide a stream of plasma to a substrate. Macro particles within the plasma stream are unaffected by the magnetic field, and thus continue to travel along the initial trajectory until they impact a particle deflector which deflects them away from the substrate.

A cross shaped vacuum chamber with four communicating sections is used to house the components of the filtered cathodic arc source. The first section contains the cathode assembly, a circular anode, and a circular extraction electrode which is placed at the exit aperture of the first section. The second section, adjacent to the first section, contains the substrate which receives the coating. The third section, directly across from the first section, houses the macro particle deflector, which, in the preferred embodiment, is a plate having a conical and tapered surface, and further includes a flange. The fourth section, directly across from the second section, contains an ion deflection plate. A set of electron emitting filaments are positioned in the center section of the chamber.

An arc transversing the surface of the cathode target generates a stream of plasma which flows away from the target surface and passes through the centers of the circular anode and the circular extraction electrode. The extraction electrode accelerates the ions and defines the initial trajectory of the plasma stream as it exits the first section and enters the center section of the vacuum chamber. A transverse magnetic field is applied to the center section of the vacuum chamber and causes the plasma stream to bend in the direction of the substrate. To counteract charge separation in the plasma stream caused by the transverse magnetic field, electron emitting filaments supply electrons which are trapped within the plasma stream. The ion deflection plate further steers the plasma toward the substrate. Macro particles in the plasma stream are unaffected by the magnetic field and continue along the initial trajectory, through the center section of the vacuum chamber, and to the particle deflector, where they are deflected away from the substrate.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE INVENTION

The present invention relates to a filtered cathodic arc source, and more particularly, to a filtered cathodic arc source in which a transverse magnetic field is used to guide a stream of plasma to a substrate, while macro particles within the plasma stream continue to travel along the initial trajectory of the plasma stream, without striking the walls of the vacuum chamber, and to a macro particle deflector, whereby macro particles are deflected away from the substrate.

Figure 1:
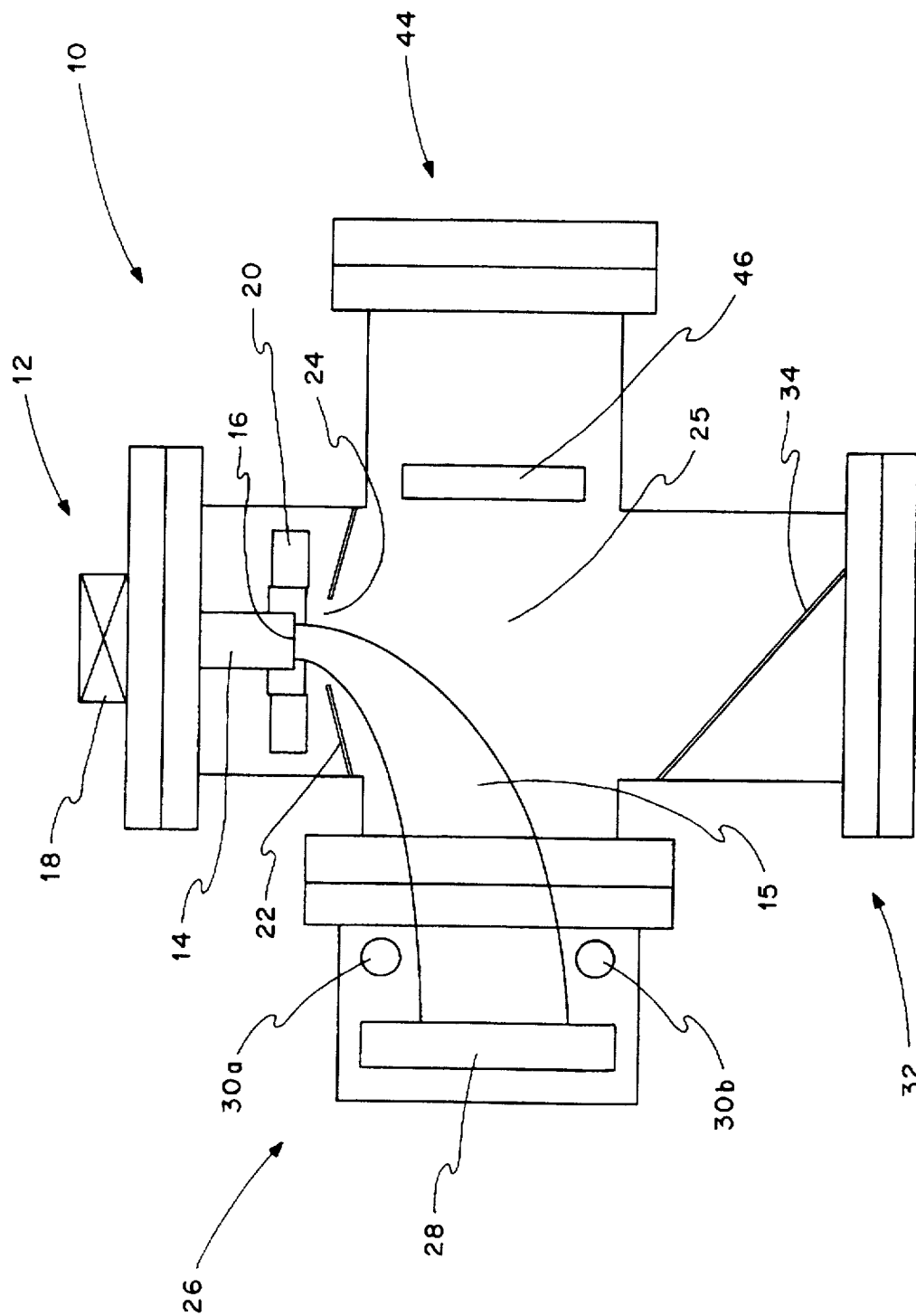
FIG. 1 is a plain view of the filtered cathodic arc source.

FIG. 1 illustrates the cross shaped vacuum chamber 10 of the present invention, which has four sections 12, 26, 32, 44 in communication with a center section 25. The first section 12 of the vacuum chamber 10 includes a cathode target 14 and a means for generating an arc (not shown), such as a trigger electrode or a mechanical striker mounted adjacent to the cathode target. The cathode target 14 has an evaporation surface 16 comprised of the material which forms the coating. The arc is struck on the surface of the cathode target 16, and the cathode material at the arc spot is vaporized into a stream of plasma 15. The arc may be directed along the evaporation surface of the cathode by an arc steering magnet 18.

Anode 20 is a ring-shaped, hollow, annular electrode positioned around the cathode target 14 and shifted forward of the surface of the cathode target 16. Anode 20 confines the arc to the surface 16 of the cathode target 14.

Extraction electrode 22, also a ring-shaped, hollow, annular electrode, is positioned at the exit aperture 24 of the first section 12. It is well known in the art to use extraction electrodes to shape the field of the plasma stream as the plasma stream travels away from the cathode target. Extraction electrodes operate at a potential $V_{ef}$ and act as an immersion lens to accelerate the ions of the plasma stream and to provide a sufficiently narrow kinetic energy range to permit well-defined trajectories in transverse electric and magnetic fields.

The second section 26 of the cross shaped chamber 10 is adjacent to the first section 12. The second section 26 contains a substrate 28, the surface of which is coated by portions of the plasma stream 15. The substrate 28 is oriented at approximately a right angle to the evaporation surface 16 of the cathode target 14, such that the substrate 28 is out of the line of sight of the cathode target 14. Where the substrate is insulated from the chamber, it is well known in the art to apply a negative bias to the substrate by a continuous and/or pulsed voltage. A negative bias increases the energy of deposition, enhancing the quality of the coating. In addition, charge neutralization filaments 30a, 30b are provided adjacent to the substrate 28 and flood the surface of the substrate 28 with electrons to eliminate a charge build-up from the positive ions of the plasma stream.

Figure 4:
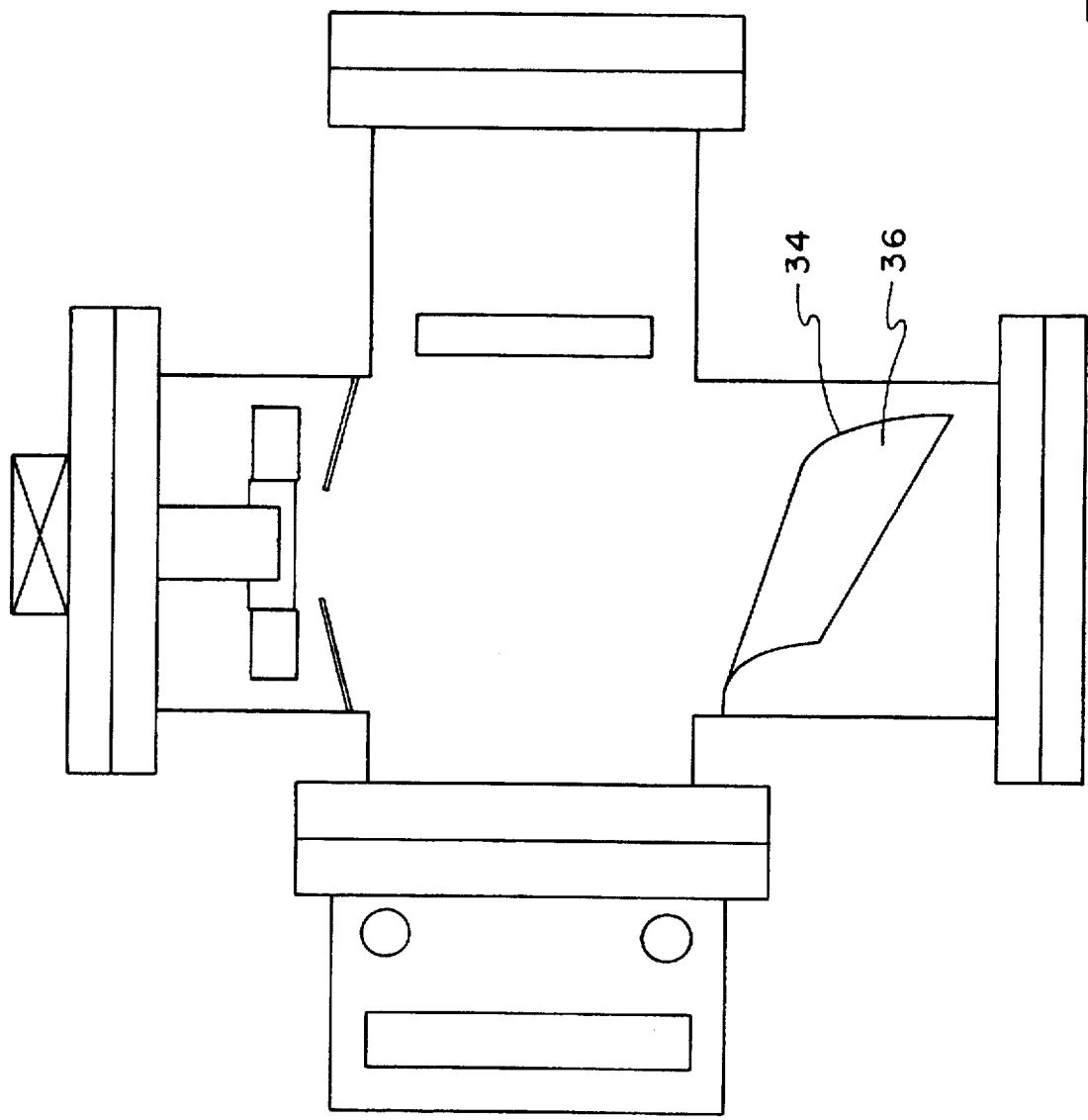
FIG. 4 is a perspective view of the particle deflector.
Figure 5:
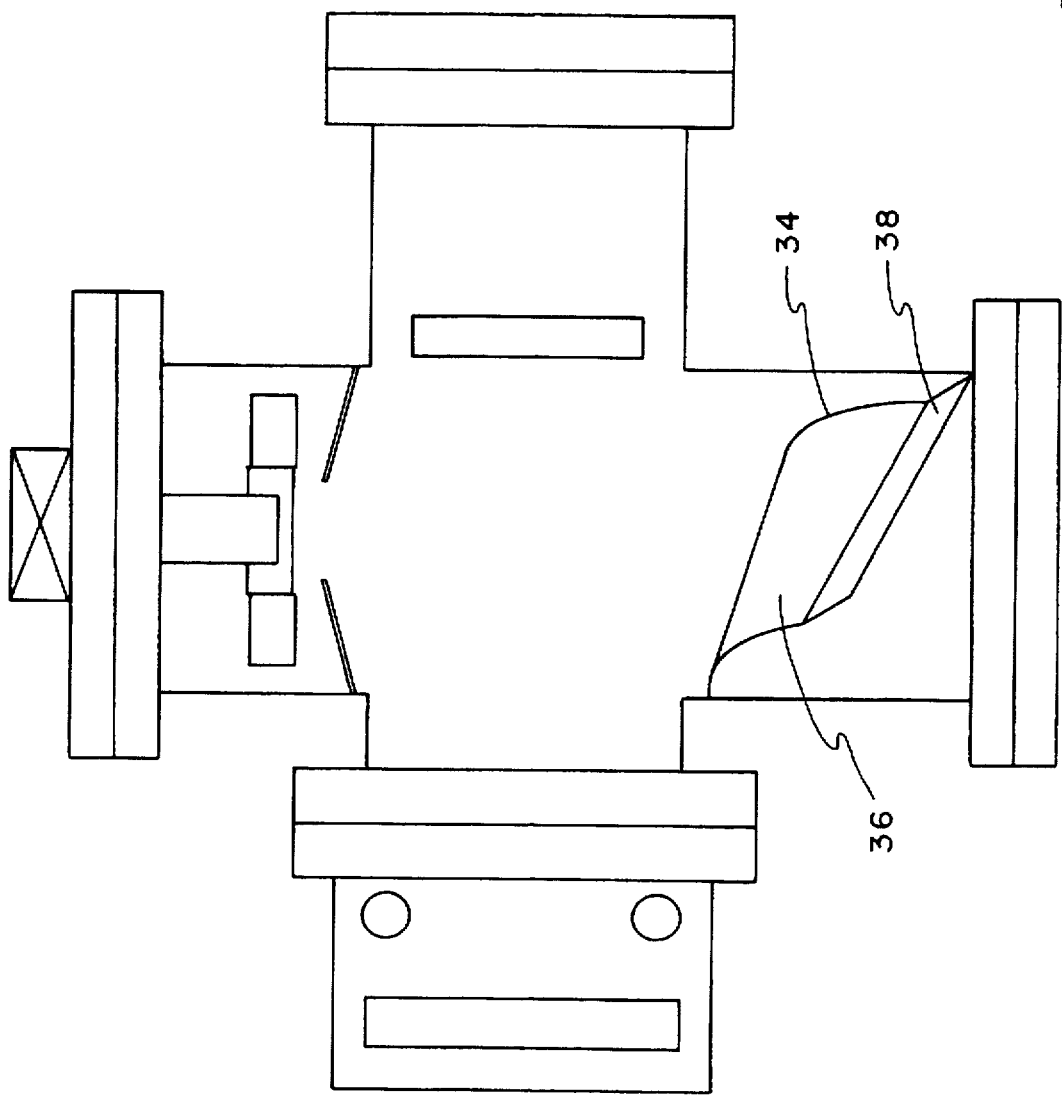
FIG. 5 is a perspective view of an alternate embodiment of the particle deflector.

The third section 32 of the cross shaped vacuum chamber 10 is directly across from the first section 12 and includes a means for deflecting 34 macro particles away from the substrate 28, such as a metal plate. FIG. 4 shows the macro particle deflector 34 having a conical and tapered surface 36, which, when macro particles strike the particle deflector 34, causes macro particles to be diverted away from the substrate 28. In a preferred embodiment, FIG. 5 shows the particle deflector 34 wherein a flange 38 is connected to an edge of the conical and tapered surface 36 of the particle deflector 34, for further deflecting macro particles away from the substrate 28.

An ion deflection plate or pusher electrode 46, FIG. 1, is provided in the fourth section 44 of the cross shaped chamber 10 approximately perpendicular to the horizontal axis of the second section. The ion deflection plate 46 steers and/or spreads the stream of plasma 15, resulting in a more uniform coating on the substrate 28. It is well known in the art to provide a plurality of electrodes within the plasma duct to enhance performance of the cathode arc source, i.e., correct drifting of the plasma stream.

Importantly, the vacuum chamber 10 is constructed in the shape of a cross, rather than in the shape of an elbow, which is prevalent in the prior art. The cross shape construction eliminates the surfaces or chamber walls which deflect macro particles toward the substrate, as occurs in the elbow design. The cross shape construction, including an area which operates as a beam dump for macro particles, therefore serves as a means for deflecting macro particles away from the substrate.

Figure 2:
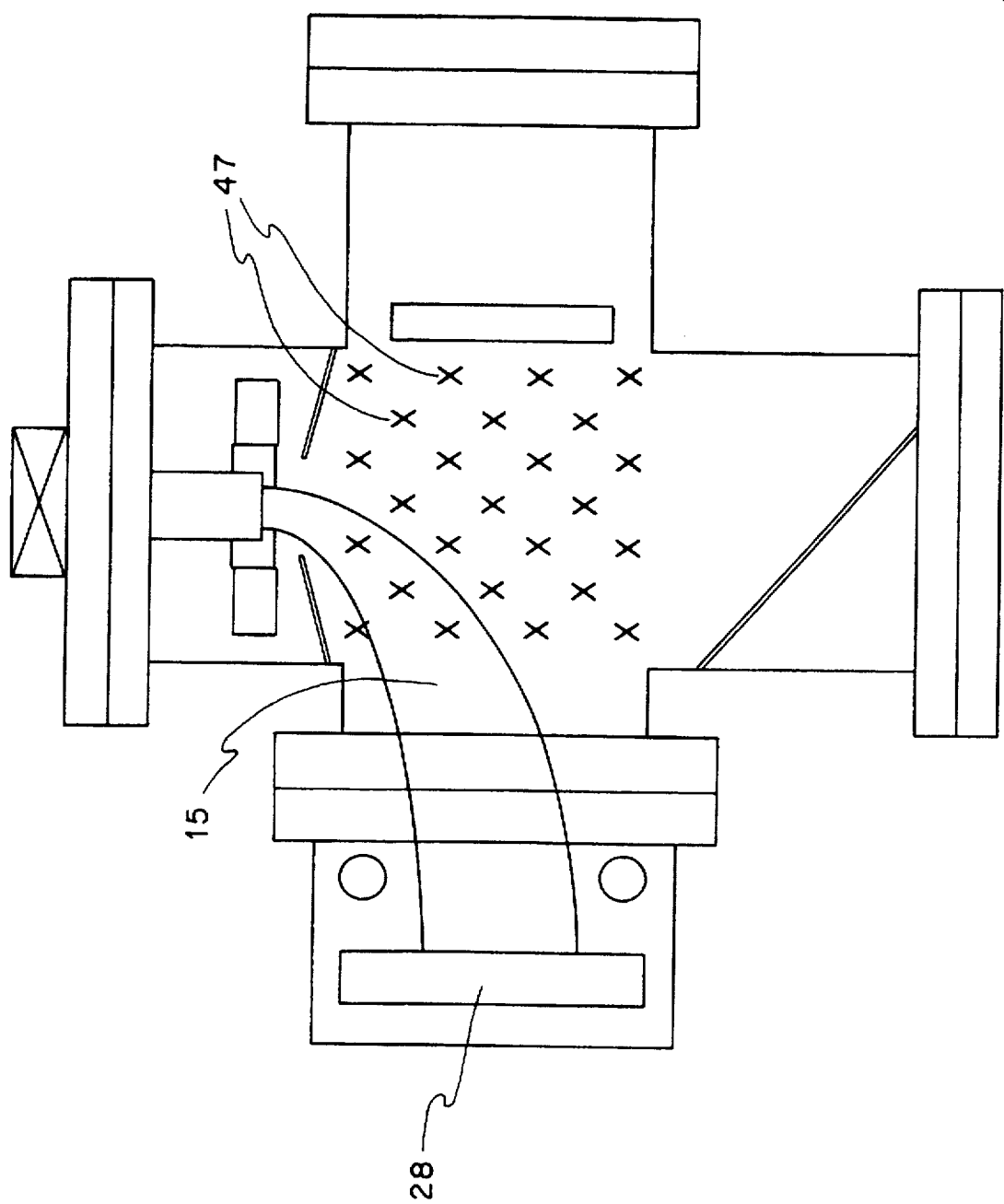
FIG. 2 is a plain view of the filtered cathodic arc source including the transverse magnetic field.

Conventional means are used to generate the transverse magnetic field 47, which is illustrated in FIG. 2. As the magnetic field 47 is normal or perpendicular to the plane of the stream of plasma 15, the plasma ions follow trajectories leading to the substrate 28. Applicant employs a transverse magnetic field 47 to steer the plasma stream 15, rather than a longitudinal magnetic field as in prior art.

Using a transverse magnetic field further reduces the interference between the magnetic field generated to guide the stream of plasma and the magnetic field generated to steer the arc along the evaporable surface of the cathode target. A sweeping magnetic field, in which the intensity of the magnetic field is varied, may also be used to deposit the ion flux over a larger area of the substrate with greater uniformity.

Figure 3:
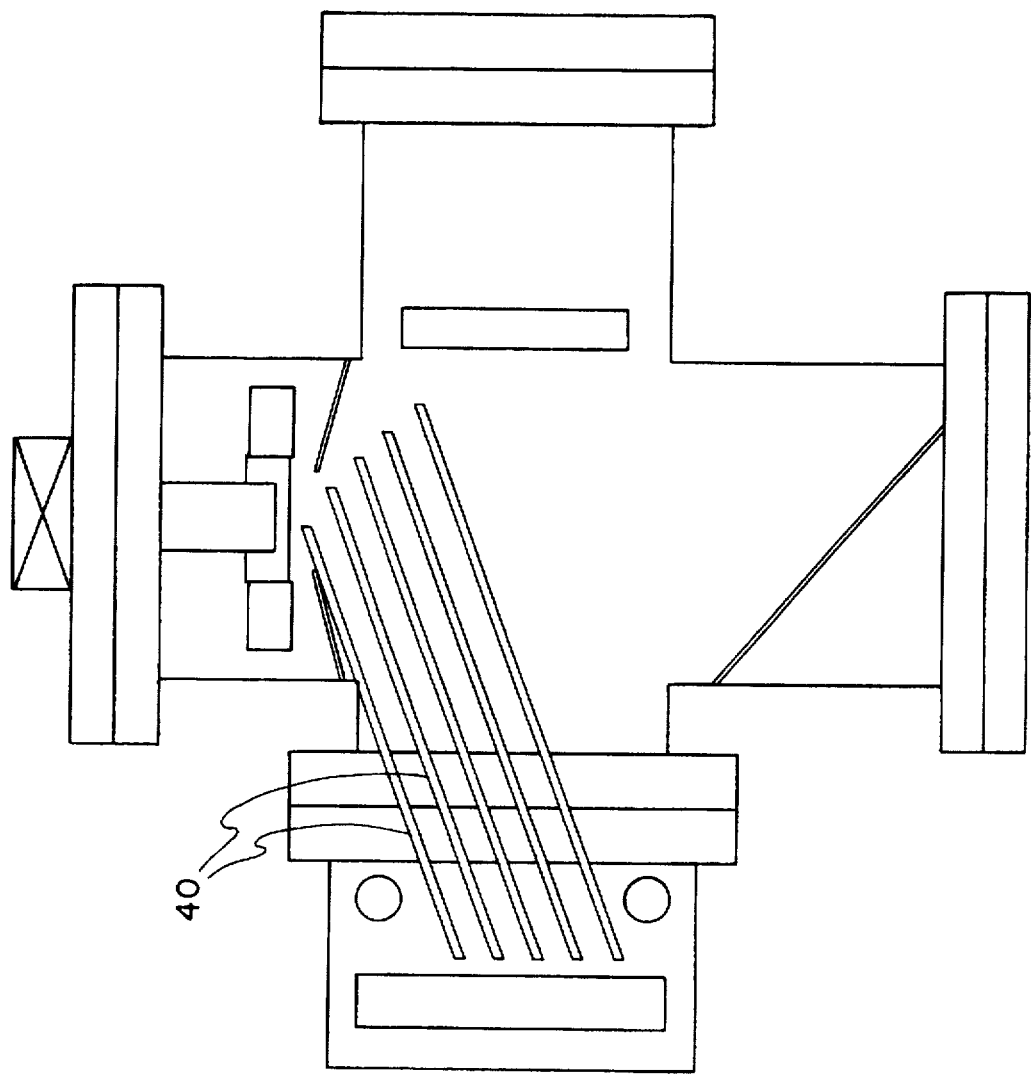
FIG. 3 is a plain view of the filtered cathodic arc source including a set of electron emitting filaments.

The transverse magnetic field causes a charge separation to occur within the stream of plasma, in which the positively charged ions expand the field of the plasma stream. To neutralize or counterbalance the swelling of the plasma stream, electron emitting filaments 40, shown in FIG. 3, are provided above and/or below the plasma stream. The electron emitting filaments 40 emit electrons which follow the magnetic field lines 47 into the plasma stream. The electrons are also attracted by the positive ions of the plasma stream to the plasma stream, where the electrons are trapped by the plasma sheath potential. Injecting electrons into the plasma stream focuses and narrows the plasma stream.

Thus, the filtered cathodic arc source operates to separate macro particles from the plasma stream as follows:

An arc is generated on the surface 16 of the cathode target 14, creating a stream of plasma 15 which is projected away from the surface 16 of the cathode target 14 towards the annular extractor electrode 22, which accelerates the ions and shapes the initial trajectory of the plasma stream 15.

A transverse magnetic field 47 (FIG. 2) is perpendicularly applied to the plasma stream 15 causing the charged portion of the plasma stream 15 to bend in the direction of the substrate 28. The ion deflection plate 46 further steers the charged portion of the stream of plasma 15 towards the substrate. However, macro particles, which are neutral, are unaffected by the magnetic and electric fields and continue to travel in a substantially straight path. Macro particles collide with the surface of the macro particle deflector 34, which is shaped to deflect macro particles away from the substrate 28 as illustrated in FIG. 4 and FIG. 5.

The transverse magnetic field 47 causes the ions and electrons in the plasma stream 15 to separate in opposite directions, resulting in a charge imbalance which decreases the ion current density and deposition rate of the plasma stream 15 onto the substrate 28. Therefore, to maintain neutrality within the stream of plasma 15, electron emitting filaments 40 are provided to supply electrons to the plasma stream 15. By using a sweeping magnetic field, and thereby varying the intensity of the magnetic field, the ion flux can be shifted across the substrate, thereby permitting deposition over a larger area than an unsteered beam. The charged stream of plasma 15 collides with and is deposited on the substrate 28, which, when insulated from the vacuum chamber, may be negatively biased. The thin coating formed on the substrate is free of macro particles.

It is understood that any processing gas, such as $O_2$, $N_2$, $H_2$, or Ar, may be added to the vacuum chamber.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. While the invention has been described with reference to details of the illustrated embodiment, these details are not intended to limit the scope of the invention, rather the scope of the invention is to be defined by the claims appended hereto.

The embodiments of the invention in which an exclusive property or privilege is claimed are defined as follows:

1. A filtered cathodic arc source for filtering macro particles from a stream of plasma, comprising:

a vacuum chamber;

a center section;

a first section in communication with said center section, first section having a longitudinal axis and containing a cathode assembly having an evaporation surface;

an anode within said first section and spaced apart from the cathode assembly;

means for generating a first stream of plasma comprised of a plurality of charged particles and a plurality of uncharged macro particles, whereby the first plasma stream travels away from the cathode assembly in a direction substantially along the first section longitudinal axis and into said center section of the vacuum chamber;

a second section in communication with said center section aid adjacent said first section, said second section containing substrate for receiving a coating thereon, and said second section having a longitudinal axis perpendicular to the first section longitudinal axis;

a third section in communication with said center section and adjacent said second section, said third section having a longitudinal axis aligned with the first section longitudinal axis;

means for generating a transverse magnetic field in said center section, the generated transverse magnetic field having field lines perpendicular to a plane defined by the longitudinal are of said first, second, and third sections, whereby the generated transverse magnetic field bifurcates the first plasma stream into a second plasma stream substantially comprised of charged particles and a third plasma stream substantially comprised of uncharged macro particles, such that the second plasma stream is diverted from said center section into said second section toward the substrate to form a coating thereon, and the third plasma steam continues undiverted from said center section into said third section; and means for deflecting third plasma stream, whereby said deflecting means is positioned within said third section for deflecting the uncharged macro particles away from the substrate.

2. The filtered cathodic arc source according to claim 1, wherein said deflecting means is it plate positioned at an angle.

3. The filtered cathodic arc source according to claim 2, wherein the plate further has a conical, tapered surface having an edge.

4. The filtered cathodic arc source according to claim 3, wherein a flange is connected to the edge of the plate.

5. The filtered cathodic arc source according to claim 1, further comprising a set of electron emitting filaments positioned within said center section for supplying electrons to any plasma stream affected by the transverse magnetic field.

6. The filtered cathodic arc source according to claim 1, further comprising an ion deflection plate having a surface approximately perpendicular to the second section longitudinal axis and external to the stream of plasma, whereby the first stream of plasma is projected between said ion deflection plate and the substrate.

7. The filtered cathodic arc source according to claim 1, further comprising at least one charge neutralization filament positioned adjacent to the substrate for eliminating a charge build up on the surface of the substrate.

8. The filtered cathodic arc source according to claim 1, further comprising means for varying the intensity of the transverse magnetic field.

9. The filtered cathodic arc source according to claim 1, further comprising means for electrically biasing the substrate.

10. A method for filtering macro particles from a plasma stream generated by a cathodic arc source, comprising:

generating a first plasma stream comprised of a plurality of charged particles and a plurality of uncharged macro particles, wherein the first plasma stream is projected in a first direction;

applying a transverse magnetic field to the first plasma stream, whereby the magnetic field lines of the transverse magnetic field are normal to the first plasma stream, thereby causing the first plasma stream to bifurcate into a second plasma stream comprised substantially of charged particles and a third plasma stream comprised substantially of uncharged macro particles;

diverting the second plasma stream by the applied transverse magnetic field in a second direction to a substrate forming a coating thereon; and deflecting the third plasma stream, the third plasma stream traveling in the first direction and unaffected by the applied transverse magnetic field, away from the substrate.

11. The method according to claim 10, further comprising the step of preforming a macro particle deflector for deflecting the third plasma stream, wherein the preformed macro particle deflector is comprised of a metal plate having an edge, a conical and tapered surface, and a flange connected to the edge of the plate.

12. The method according to claim 10, further comprising the step of injecting electrons into any plasma stream affected by the transverse magnetic field.

13. The method according to claim 10, further comprising the step of accelerating the second plasma stream in the direction of the substrate by position an ion deflection plate in proximity to the second plasma stream.

14. The method according to claim 10, further comprising the step of eliminating a charge build up on the surface of th substrate by providing at least one charge neutralization filament adjacent to the substrate.

15. The method according to claim 10, further comprising the step of varying the intensity of the transverse magnetic field.

16. The filtered cathodic arc source according to claim 6, wherein the ion deflection plate is disposed within a fourth section communicating with said center section and adjacent said first and third sections, said fourth section having a longitudinal axis substantially aligned with said second section.

17. A filtered cathodic arc source for filtering macro particles from a stream of plasma, wherein the filter is a vacuum chamber comprising:

a center section;

a first section in communication with said center section, said first section having a longitudinal axis and containing a cathode assembly having an evaporation surface;

an anode within said first section and spaced apart from said cathode assembly;

means for generating a first stream of plasma comprised of a plurality of charged particles and a plurality of uncharged macro particles, whereby said first plasma stream travels away from the cathode assembly in a direction substantially along the first section longitudinal axis and into said center section of the vacuum chamber;

a second section in communication with said center section and adjacent said first section, said second section containing a substrate for receiving a coating hereon, and said second section having a longitudinal axis perpendicular to the first section longitudinal axis;

a third section in communication with said center section and adjacent said second section, said third section having a longitudinal axis aligned with the first section longitudinal axis;

means for generating a transverse magnetic field in said center section, the generated transverse magnetic field having field lines perpendicular to the plane defined by the longitudinal axes of said first, second, and third sections, whereby the generated transverse magnetic field bifurcates the first plasma stream into a second plasma stream substantially comprised of charged particles and a third plasma stream substantially comprised of uncharged macro particles, such that the second plasma stream is diverted from said center section into said second section toward the substrate to form a coating thereon, and the third plasma stream continues undiverted from said center section into said third section;

means for deflecting the third plasma stream, whereby said deflecting means is positioned within said third section for deflecting the uncharged macro particles away from said substrate; and a set of electron emitting filaments positioned within the center section of the vacuum chamber for supplying electrons to any plasma stream affected by the transverse magnetic field.

\* \* \* \* \*